(12) United States Patent
Sarig et al.

(10) Patent No.: US 6,956,771 B2
(45) Date of Patent: Oct. 18, 2005

(54) VOLTAGE CONTROL CIRCUIT FOR HIGH VOLTAGE SUPPLY

(75) Inventors: Erez Sarig, Migdal Haemek (IL); Ran Rosenweig, Midgal Haemek (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 496 days.

(21) Appl. No.: 10/228,452

(22) Filed: Aug. 26, 2002

(65) Prior Publication Data

US 2004/0036363 A1    Feb. 26, 2004

(51) Int. Cl.[7] ............................................. G11C 16/00
(52) U.S. Cl. ........................ 365/185.18; 365/185.23; 365/189.11; 365/226
(58) Field of Search ................... 365/185.18, 185.23, 365/189.11, 226

(56) References Cited

U.S. PATENT DOCUMENTS

| | | | |
|---|---|---|---|
| 5,319,604 A | * | 6/1994 | Imondi et al. ......... 365/185.18 |
| 5,335,200 A | * | 8/1994 | Coffman et al. ............ 365/218 |
| 5,646,898 A | * | 7/1997 | Manning ..................... 365/205 |
| 6,184,594 B1 | | 2/2001 | Kushnarenko .............. 307/104 |

* cited by examiner

Primary Examiner—Tan T. Nguyen
(74) Attorney, Agent, or Firm—Bever, Hoffman & Harms, LLP; Patrick T. Bever

(57) ABSTRACT

A voltage control circuit that utilizes a level-shifter circuit and a switch circuit to isolate a charge pump output terminal from a system voltage source when a charge pump is enabled, and to couple the charge pump output terminal to the system voltage source when the charge pump is disabled. The level-shifter circuit receives the charge pump output voltage as its high voltage supply and the charge pump enable signal as its input signal, and transmits the charge pump output voltage from its output terminal when the charge pump is enabled, and zero volts when the charge pump is disabled. The switch circuit includes a PMOS transistor constructed such that its bulk and source are connected to the charge pump output terminal, and its drain is connected to the system voltage source. The switch circuit also includes a guard ring structure surrounding the PMOS transistor.

20 Claims, 3 Drawing Sheets

VOLTAGE CONTROL CIRCUIT FOR HIGH VOLTAGE SUPPLY

FIELD OF THE INVENTION

The present invention generally relates to integrated circuit devices including high voltage supplies (charge pumps), and more particularly to voltage control circuits for controlling voltages generated on such integrated circuit devices.

BACKGROUND OF THE INVENTION

As the system operating voltages of modern integrated circuits (ICs) continue to decrease, the use of internal high voltage supply circuits is increasing. These internal high voltage supply circuits, which are typically referred to as "charge pumps", are often utilized to provide high operating voltages during certain IC operations that require voltages higher than the system voltage. For example, in floating gate-type memory circuits, a charge pump is utilized to generate high programming voltages that are used during write operations to store a charge in a non-volatile memory cell of an IC device, such as electrically erasable/programmable read only memory (EEPROM) devices, or products of the microFLASH® technology family that are produced by the assignee of the present invention. In such applications, the charge pump is enabled during the high voltage (e.g., write/erase) operations, and then disabled during low voltage (e.g., read) operations.

When a charge pump is disabled, it is typically important to maintain the charge pump output terminal at the system operating voltage (or higher) to prevent voltage mismatch in the circuits connected to the charge pump output terminal. For example, when an IC includes one or more inverters connected to the charge pump output terminal, it is important to maintain the charge pump output at the system voltage when the charge pump is turned off to prevent these inverters from leaking.

FIG. 1 is a simplified schematic diagram showing a portion of an IC 10 including a conventional arrangement for maintaining an output terminal 21 of a charge pump 20 at a system voltage $V_{DD}$ when charge pump 20 is disabled. In particular, the conventional arrangement utilizes a PMOS transistor 30 connected between system voltage $V_{DD}$ and output terminal 21, with the gate of PMOS transistor 30 controlled by the charge pump enable control signal EN. In particular, when charge pump 20 is turned on (i.e., control signal EN is asserted, or high), charge pump 20 is turned on to generate an output voltage that is greater than system voltage $V_{DD}$, and PMOS transistor 30 is turned off in an attempt to isolate output terminal 21 from system voltage source $V_{DD}$. When charge pump 20 is subsequently turned off (control signal EN is de-asserted), the low (de-asserted) control signal EN turns on PMOS transistor 30, thereby connecting output terminal 21 to system voltage source $V_{DD}$.

The conventional solution shown in FIG. 1 presents two problems.

First, when charge pump 20 is enabled, the voltage at the body (or bulk) B of PMOS transistor 30 must be as high as the source (S) side voltage (which is higher than system voltage $V_{DD}$ when charge pump 20 is enabled) in order to prevent a forward-biased diode between the source S and bulk B. However, as indicated in FIG. 1, the bulk B is typically tied to the drain D, which is maintained at $V_{DD}$, so a forward-biased diode is typically generated that results in leakage of the charge pump output to the $V_{DD}$ source.

Second, in order to reliably maintain PMOS transistor 30 in a high impedance state while charge pump 20 is enabled, the control signal EN applied to the gate terminal of PMOS transistor 30 must be system voltage $V_{DD}$ or higher. However, control signal EN is often below system voltage $V_{DD}$ due to wire resistances and/or switching transistor drops, thereby resulting in leakage of the charge pump output to the $V_{DD}$ source while the charge pump is enabled.

What is needed is a voltage control circuit that reliably isolates a charge pump output terminal from the system voltage source when the charge pump is enabled, and reliably couples the charge pump output terminal to the system voltage source when the charge pump is disabled.

SUMMARY OF THE INVENTION

The present invention is directed to a voltage control circuit that utilizes a level-shifter circuit and a switch circuit to reliably isolate a charge pump output terminal from a system voltage source when a charge pump is enabled, and to reliably couple the charge pump output terminal to the system voltage source when the charge pump is disabled.

In accordance with a first aspect of the present invention, the level-shifter circuit is connected to receive the charge pump output voltage as its high voltage supply and the charge pump enable signal as its input signal. The level-shifter circuit is constructed to transmit the charge pump output voltage to the gate terminal of a PMOS transistor, which forms part of the switch circuit, when the charge pump is enabled, and to transmit zero Volts to the gate terminal of the PMOS transistor when the charge pump is disabled. By coupling the gate terminal of the PMOS transistor to the charge pump output voltage, the voltage control circuit of the present invention reliably isolates the charge pump output terminal from the system voltage source when the charge pump is enabled. Conversely, by coupling the gate terminal of PMOS transistor to ground in the absence of the charge pump output voltage, the voltage control circuit of the present invention reliably couples the charge pump output terminal to the system voltage source while the charge pump is disabled.

In accordance with a second aspect of the present invention, the switch circuit of the voltage control circuit is constructed such that the bulk of the PMOS transistor is connected to the charge pump output terminal (i.e., the bulk is tied to the source-side voltage), and switch circuit includes a guard ring structure to minimize the possibility of latch-up during power up of the system voltage. In one embodiment, the guard ring structure includes three concentric rings connected to the system voltage source, ground, and system voltage source, respectively. Located inside the innermost guard ring is an n-well region in which parallel elongated p-type doped regions are diffused, including a central p-type doped region that serves as a drain of the PMOS transistor and is connected by an associated metal structure to the system voltage source, and two p-type doped regions located on each side of the central region that serve as the source of the PMOS transistor and are connected by associated metal structures to the charge pump output terminal. Also formed in the n-well region are elongated n-type doped regions that are also connected to the source metal structures, and serve to couple the body (bulk) of the PMOS transistor to the source.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

Figure 2:
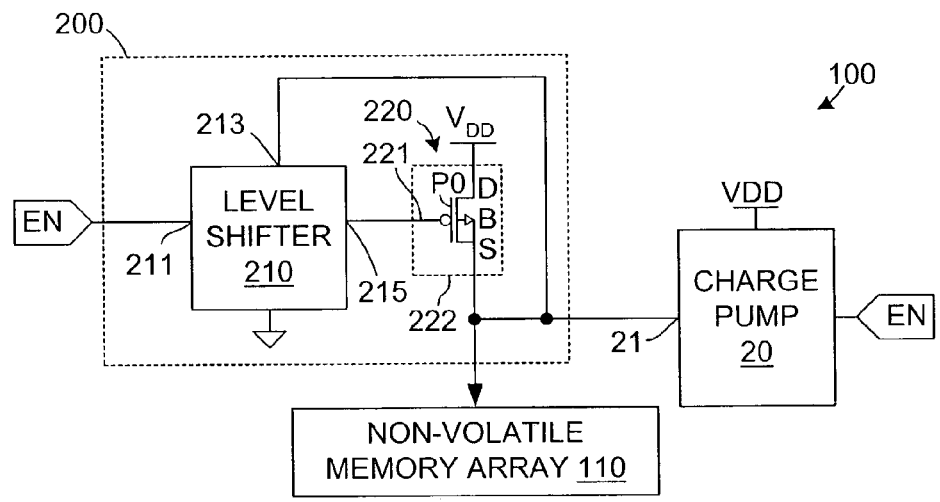
FIG. 2 is a block diagram showing a non-volatile memory circuit including a voltage control circuit according to the present invention.

FIG. 2 is a block diagram showing an integrated circuit (IC) 100 including a conventional charge pump 20, and a voltage control circuit 200 that is formed in accordance with the present invention, and additional circuitry, such as a non-volatile memory array 110, that is connected to an output terminal 21 of charge pump 20. Consistent with conventional integrated circuits, IC 100 includes a ground source and a system voltage source $V_{DD}$, which is relatively low in comparison to a charge pump voltage generated by charge pump 20 (e.g., the charge pump voltage is greater than or equal to 1.5 times $V_{DD}$). Note also that charge pump 20 generates the charge pump voltage only when a charge pump enable signal EN is asserted (e.g., $V_{DD}$), and is turned off when charge pump enable signal EN is de-asserted (e.g., ground or 0 Volts).

In accordance with the present invention, voltage control circuit 200 includes a level-shifter circuit 210 and a switch circuit 220. Level-shifter circuit 210 includes a control (first) terminal 211 connected to receive charge pump enable signal EN. Level-shifter circuit 210 also includes a high voltage (second) terminal 213 connected to output terminal 21 of charge pump 20, a ground input terminal, and an output terminal 215 that is connected to a gate terminal 221 of switch circuit 220. Switch circuit 220 includes a PMOS transistor P0 that is connected between system voltage source $V_{DD}$ and output terminal 21 of charge pump 20.

Figure 1:
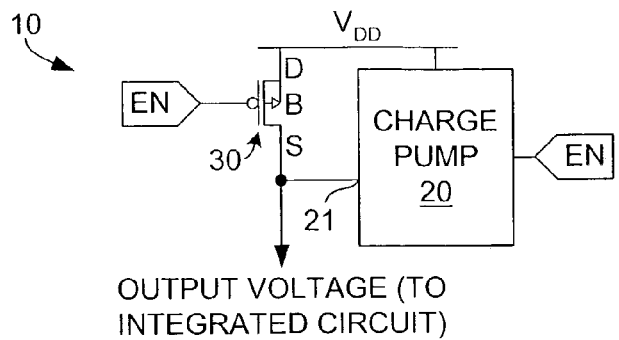
FIG. 1 is a simplified schematic diagram showing a conventional voltage control structure.

Similar to conventional structures (e.g., see FIG. 1), switch circuit 220 is controlled to connect output terminal 21 to system voltage source $V_{DD}$ when charge pump 20 is disabled, and to isolate output terminal 21 from the system voltage source when charge pump 20 is enabled. However, unlike conventional structures, switch circuit 220 performs this operation under the control of level-shifter circuit 210 such that gate terminal 221 of switch circuit 220 is pulled up to the charge pump output voltage when charge pump 20 is enabled, and gate terminal 221 is pulled down to ground when charge pump 20 is disabled. Because the charge pump output voltage is higher than system voltage $V_{DD}$, leakage from output terminal 21 to system voltage source $V_{DD}$ is reliably prevented when charge pump 20 is enabled (i.e., when switch circuit 220 is turned off). Accordingly, voltage control circuit 200 reliably isolates charge pump output terminal 21 from system voltage source $V_{DD}$ when charge pump 220 is enabled, and reliably couples charge pump output terminal 21 to system voltage source $V_{DD}$ when charge pump 220 is disabled.

Figure 3:
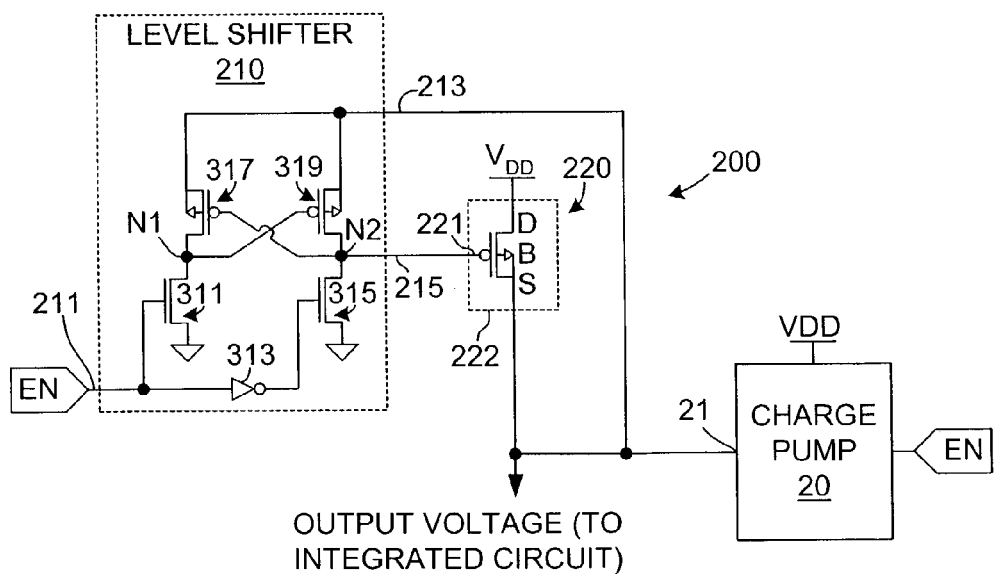
FIG. 3 is a simplified schematic diagram showing a portion of an integrated circuit including a voltage control circuit according to an embodiment of the present invention.

FIG. 3 is a simplified schematic diagram showing voltage control circuit 200 in additional detail in accordance with a specific embodiment of the present invention. In particular, referring to the left side of FIG. 3, control terminal 211 is connected to the gate terminal of a first NMOS pull-down transistor 311 and to the input terminal of an inverter 313, whose output terminal is connected to the gate terminal of a second NMOS pull-down transistor 315. NMOS transistor 311 is connected between a first node N1 and ground, and second NMOS transistor 315 is connected between a second node N2 and ground. Level-shifter circuit 220 also includes a first PMOS pull-up transistor 317 and a second PMOS pull-up transistor 319 connected between high voltage terminal 213 and nodes N1 and N2, respectively. In particular, first PMOS transistor 317 is connected between high voltage terminal 213 and first node N1, and has a gate terminal connected to second node N2. Similarly, second PMOS transistor 319 is connected between high voltage terminal 213 and second node N2, and has a gate terminal connected to first node N1.

During operation, when charge pump control signal EN is de-asserted (low), first NMOS transistor 311 is turned off, and second NMOS transistor 315 (which receives a high voltage signal from inverter 313) is turned on, thereby pulling second node N2 to ground. The low voltage at second node N2 turns off switch circuit 220, thereby coupling output terminal 21 of charge pump 20 to system voltage $V_{DD}$, and also turns on PMOS transistor 317. Because output terminal 21 is maintained at system voltage $V_{DD}$ and PMOS transistor 317 is turned on, system voltage $V_{DD}$ is applied to the gate terminal of PMOS transistor 319 (via first node N1). Accordingly, PMOS transistor P0 is reliably turned on when charge pump enable signal EN is de-asserted.

In contrast, when charge pump control signal EN is asserted (i.e., when charge pump 20 generates a charge pump voltage at output terminal 21 that is higher than system voltage $V_{DD}$), first NMOS transistor 311 is turned on, thereby pulling first node N1 to ground, and second NMOS transistor 315 is turned off. The low voltage at first node N1 turns on PMOS transistor 319, thereby coupling the charge pump output voltage generated by charge pump 20 to second node N2. The charge pump output voltage thus generated at second node N2 is applied to the gate terminals of PMOS transistor 317 and PMOS transistor P0 (via output terminal 215), thereby turning these transistors off. Because gate terminal of PMOS transistor P0 is maintained at the charge pump output voltage, which is higher than system voltage source $V_{DD}$, leakage from charge pump output terminal 21 to system voltage source $V_{DD}$ is reliably prevented.

A potential problem associated with connecting a conventional PMOS transistor between charge pump output terminal 21 and system voltage source $V_{DD}$ (i.e., with the gate terminal of the PMOS transistor coupled to charge pump output terminal 21 via level-shifter circuit 210) is the possibility of latch-up of the conventional PMOS transistor during system power up (i.e., as system voltage $V_{DD}$ ramps up when an external power source is applied to the IC chip).

As indicated in FIGS. 2 and 3, according to a second aspect of the present invention, switch circuit 220 differs from a conventional PMOS transistor in that the bulk B of PMOS transistor P0 is connected (tied) to its source S, rather than its drain D, and is surrounded by a guard ring structure 222. With this arrangement, the bulk B is coupled to charge pump output terminal 21, rather than to system voltage source $V_{DD}$ (i.e., the resistance between the bulk B and source S is reduced). As described in additional detail below, this coupling between the bulk B and source S of PMOS transistor P0 is achieved using a "butt-head" transistor arrangement in which the number of taps to the bulk and source are maximized. With this structure, PMOS transistor P0 provides a forward-biased diode between its bulk B and voltage source $V_{DD}$ during power up, which actually helps to "open" PMOS transistor P0 to charge the output voltage of charge pump 20 (i.e., in parallel with the internal operation of charge pump 20). This forward-biased diode begins to shut down when the output voltage of charge pump 20 approaches $V_{DD}$ minus the voltage drop across the diode, and turns off when the voltage across PMOS transistor P0 is 0 volts. Because the charge pump output voltage is always higher than system voltage $V_{DD}$, the bulk B of PMOS transistor P0 will always be equal to or higher than the source S and drain D.

Figure 4:
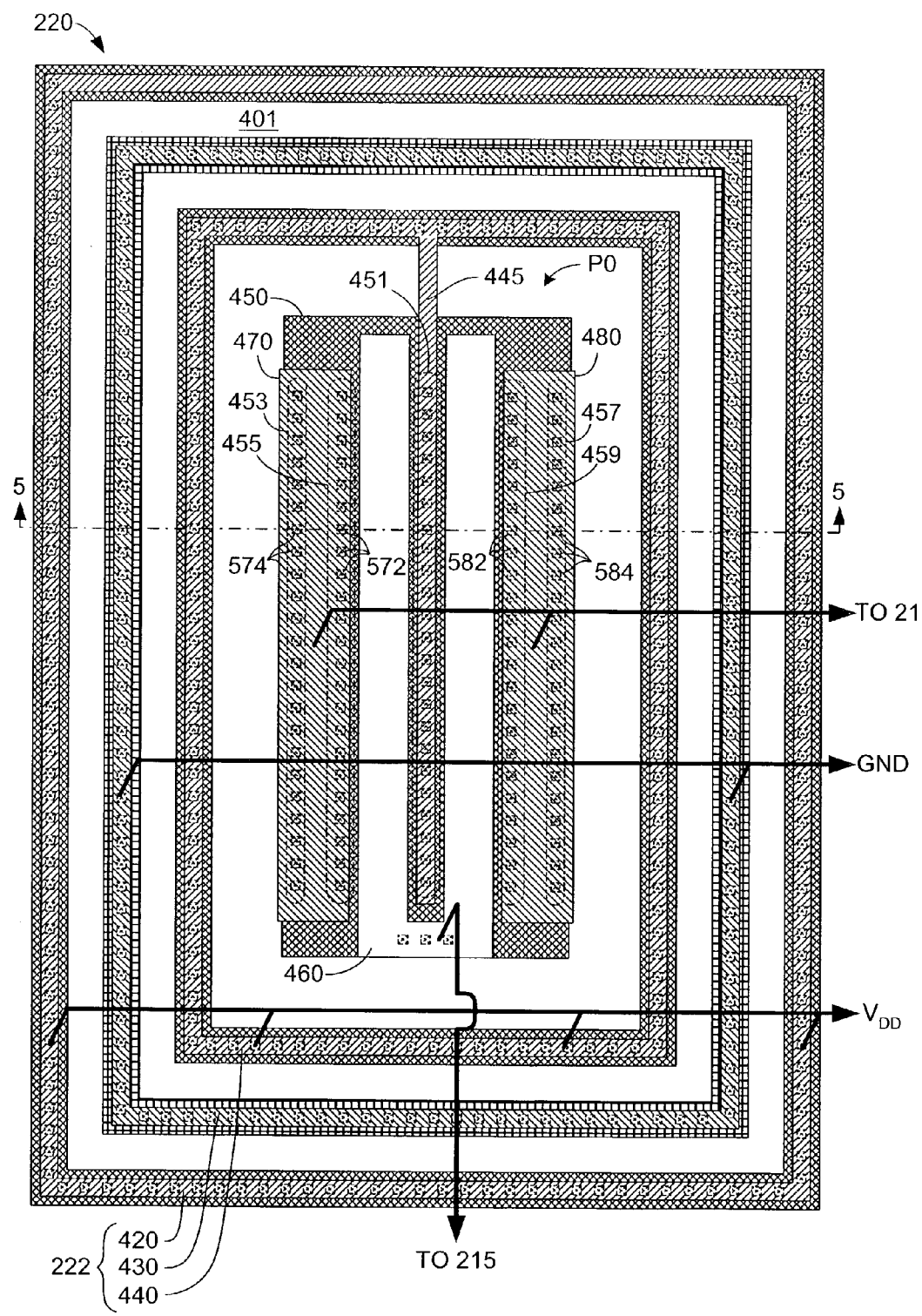
FIG. 4 is a simplified plan view showing the layout of a PMOS transistor utilized in the voltage control circuit of FIG. 3 according to another embodiment of the present invention.
Figure 5:
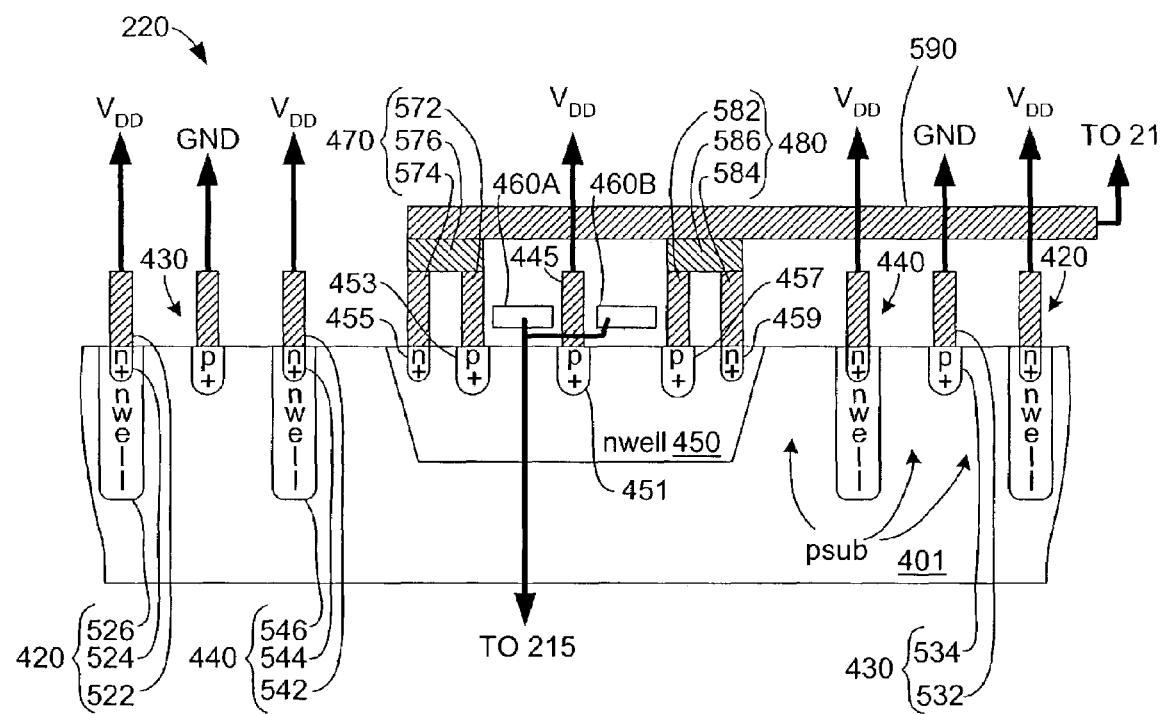
FIG. 5 is a simplified cross-sectional view showing the PMOS transistor of FIG. 4.

FIGS. 4 and 5 are plan and cross-sectional side views showing an exemplary switch circuit 220 according to another specific embodiment of the present invention.

Referring to FIG. 4, switch circuit 220 is formed on a p-type substrate 401, and includes PMOS transistor P0 surrounded by guard ring structure 222.

Referring to the reference numbers located at the lower portion of FIG. 4, guard ring structure 222 includes three concentric guard rings: an outer (first) guard ring 420 that is maintained at system voltage $V_{DD}$, a middle (second) guard ring 430 that is connected to ground (GND), and an inner (third) guard ring 450 that is also maintained at system voltage $V_{DD}$. As depicted by the horizontal heavy dark arrows in FIG. 4, each guard ring of guard ring structure 222 is connected via metal lines (not shown) multiple times to a corresponding voltage source (i.e., either system voltage $V_{DD}$ or ground) to facilitate a uniform distribution of the applied voltage throughout the guard ring. Triple guard ring structure 222 is provided to prevent latch-up of PMOS transistor P0 with neighboring transistors, thereby facilitating reliable operation.

As indicated in FIG. 5, each guard ring consists of a metal ring structure and metal vias (indicated as dashed squares in FIG. 4) that extend down from the metal ring structure and contact a doped region formed in substrate 401. For example, outer guard ring 420 includes a metal ring structure 522 that contacts an n+ doped region 524, which in turn is formed in a first narrow n-type well (nwell) region 526. Similarly, inner guard ring 440 includes a metal ring structure 542 contacting an n+ doped region 524, which in turn is formed in a second narrow n-type well (nwell) region 526. Middle guard ring 430 includes a metal ring 532 contacting a p+ doped region 534, which is formed in p-type substrate 401.

Referring to FIG. 4 and FIG. 5, PMOS transistor P0 is a split-type transistor located in the middle of inner guard ring 440, and includes a central (drain) contact 445 that extends between source/bulk structures 470 and 480, which are formed over a relatively wide n-type well region 450. In particular, central contact 445 is connected (tapped) by vias that extend down to contact an elongated (first) p+ type doped region 451, which is formed in a central region of well region 450 and serves as the drain of PMOS transistor P0. Also formed in well region 450 and aligned parallel to doped region 451 are a (first) elongated n+ type doped region 453, a (second) p+ type doped region 455, a (second) elongated n+ type doped region 457, and a (third) p+ type doped region 459. A U-shaped polysilicon gate structure 460, which is connected to output terminal 215 of level-shifter circuit 210, is formed on a suitable insulator (not shown) over well region 450. Gate structure 460 includes elongated arms that extend along the sides of doped region 451 such that a first arm 460A forms a gate for controlling current flow through well region 450 between doped region 451 and doped region 453, and a second arm 460B forms a gate for controlling current flow through well region 450 between doped region 451 and doped region 457. As shown in FIG. 4, first elongated source/bulk structure 470 is formed over the left side of well region 450, and second elongated source/bulk structure 480 is formed over the right side of well region 450. Source/bulk structure 470 is connected by a maximum number of source taps (i.e., first contact structures 572 that contact p+ source region 453), a maximum number of bulk taps (i.e., second contact structures 574 that contact the bulk via n+ doped region 455), and a bridge structure 574 connecting contact structures 572 and 574 (i.e., a "butted tap" arrangement). Similarly, metal structure 480 includes a maximum number of source taps (i.e., first contact structures 582 contacting p+ doped region 457), a maximum number of bulk taps (i.e., second contact structures 584 contacting n+ doped region 459), and a bridge structure 586 connecting contact structures 582 and 584. Finally, as shown in FIG. 5, a metal structure 590 connects metal structures 470 and 480 together, and extends over PMOS transistor P0 to provide a contact to output terminal 21 of charge pump 20 (see FIGS. 2 and 3). The number of taps are maximized to minimize contact resistances between the source and bulk.

When the charge pump is enabled (i.e., when charge pump enable signal EN is asserted), level-shifter circuit 210 passes the charge pump output voltage to gate structure 460 in the manner described above, and the charge pump output voltage is also applied directly from output terminal 21 to metal structures 470 and 480. By applying the charge pump output voltage to gate structure 460, the channels formed in well region 450 between the drain diffusion (doped region) 451 and the source diffusions (doped regions) 455 and 459 are fully turned off, thereby reliably isolating charge pump output terminal 21 from system voltage source $V_{DD}$ when charge pump 20 is enabled.

In contrast, when charge pump 20 is disabled (i.e., when charge pump enable signal EN is de-asserted), level-shifter circuit 210 pulls gate structure 460 to ground in the manner described above, thereby opening the channels formed in well region 450 between the drain diffusion (doped region) 451 and the source diffusions (doped regions) 455 and 459. With these channels fully opened, charge pump output terminal 21 is reliably coupled to system voltage source $V_{DD}$ when the charge pump is disabled.

Although the present invention has been described with respect to certain specific embodiments, it will be clear to those skilled in the art that the inventive features of the present invention are applicable to other embodiments as well, all of which are intended to fall within the scope of the present invention. Thus, the invention is limited only by the following claims.

What is claimed is:

1. A voltage control circuit for an integrated circuit having an internal voltage source for generating a relatively low system voltage, and including a charge pump for selectively generating, in response to a charge pump enable signal, a charge pump voltage that is different from the system voltage, the charge pump voltage being generated at an output terminal of the charge pump, the voltage control circuit comprising:

a level-shifter circuit having a first terminal connected to receive the charge pump enable signal, a second terminal connected to the output terminal of the charge pump, and an output terminal; and a switch circuit connected between the system voltage and the output terminal of the charge pump, the switch circuit having a gate terminal connected to the output terminal of the level shifter.

2. The voltage control circuit according to claim 1, wherein the level-shifter circuit comprises:

a first NMOS transistor connected between a first node and ground, and having a gate terminal connected to receive the charge pump enable signal;

an inverter having an input terminal connected the gate terminal of the first NMOS transistor;

a second NMOS transistor connected between the output terminal of the level-shifter circuit and ground, and having a gate terminal connected to an output terminal of the inverter;

a first PMOS transistor connected between the output terminal of the charge pump and the first node, the first PMOS transistor having a gate terminal connected to the output terminal of the level-shifter circuit; and a second PMOS transistor connected between the output terminal of the charge pump and the output terminal of the level-shifter circuit.

3. The voltage control circuit according to claim 1, wherein the switch circuit comprises:

a PMOS transistor having a source connected to the output terminal of the level-shifter circuit, and a bulk tied to the source; and a guard ring structure surrounding the PMOS transistor.

4. The voltage control circuit according to claim 3, wherein the PMOS transistor comprises:

an n-type well region;

a first elongated p-type doped region formed in the n-type well region;

a first elongated n+ type doped region formed in the n-type well region and aligned in parallel with the first p-type doped region;

a second elongated p-type doped region formed between the first p-type doped region and the first n+ type doped region;

a drain metal structure connected between the first elongated p-type doped region and the system voltage source;

a first source metal structure connected to the output terminal of the charge pump, the first elongated n+ type doped region, and the second elongated p-type doped region; and a gate structure formed over a channel region of the n-type well region located between the first and second p-type doped regions, wherein the gate structure is connected to the output terminal of the level-shifter circuit.

5. The voltage control circuit according to claim 4, wherein the PMOS transistor further comprises:

a second elongated n+ type doped region formed in the n-type well region such that the first p-type doped region is located between the second elongated n+ type doped region and the second elongated p-type doped region;

a third elongated p-type doped region formed between the first p-type doped region and the second n+ type doped region; and a second source metal structure connected to the output terminal of the charge pump, the second elongated n+ type doped region, and the third elongated p-type doped region, wherein the gate structure further comprises a second portion formed over a channel region of the n-type well region located between the first and third p-type doped regions.

6. The voltage control circuit according to claim 3, wherein the guard ring structure comprises:

a first guard ring connected to the system voltage source;

a second guard ring located inside of the first guard ring and connected to ground; and a third guard ring located inside of the second guard ring and connected to the system voltage source.

7. The voltage control circuit according to claim 6, wherein the third guard ring comprises:

an ring-shaped n-type well region formed in a substrate;

an n+ type diffusion region formed in the ring-shaped n-type well region adjacent to a surface of the substrate, and a ring-shaped metal structure formed over a substrate and contacting the n+ type diffusion.

8. The voltage control circuit according to claim 7, wherein the PMOS transistor comprises:

a central n-type well region formed in a region of the substrate surrounded by the third guard ring such that a p-type substrate region is located between the ring-shaped n-type well region and the central n-type well region;

a first elongated p-type doped region formed in the central n-type well region;

a drain metal structure extending over the p-type substrate region and connecting the first elongated p-type doped region and the ring-shaped metal structure of the third guard ring; and a first source metal structure connected to the output terminal of the charge pump, the first elongated n+ type doped region, and the second elongated p-type doped region.

9. The voltage control circuit according to claim 7, wherein the PMOS transistor further comprises:

a first elongated n+ type doped region formed in the central n-type well region and aligned in parallel with the first p-type doped region;

a second elongated p-type doped region formed between the first p-type doped region and the first n+ type doped region;

a gate structure formed over a channel region of the n-type well region located between the first and second p-type doped regions, wherein the gate structure is connected to the output terminal of the level-shifter circuit.

10. A non-volatile memory circuit having an internal voltage source for generating a relatively low system voltage, the non-volatile memory circuit comprising:

a charge pump for selectively generating, in response to a charge pump enable signal, a charge pump voltage that is different from the system voltage;

a non-volatile memory array connected to an output terminal of the charge pump; and a voltage control circuit including:

a level-shifter circuit having a first terminal connected to receive the charge pump enable signal, a second terminal connected to the output terminal of the charge pump, and an output terminal; and a switch circuit connected between the system voltage and the output terminal of the charge pump, the switch circuit having a gate terminal connected to the output terminal of the level shifter.

11. The non-volatile memory circuit according to claim 10, wherein the level-shifter circuit of the voltage control circuit comprises:
a first NMOS transistor connected between a first node and ground, and having a gate terminal connected to receive the charge pump enable signal;
an inverter having an input terminal connected the gate terminal of the first NMOS transistor;
a second NMOS transistor connected between the output terminal of the level-shifter circuit and ground, and having a gate terminal connected to an output terminal of the inverter;
a first PMOS transistor connected between the output terminal of the charge pump and the first node, the first PMOS transistor having a gate terminal connected to the output terminal of the level-shifter circuit; and
a second PMOS transistor connected between the output terminal of the charge pump and the output terminal of the level-shifter circuit.

12. The non-volatile memory circuit according to claim 10, wherein the switch circuit of the voltage control circuit comprises:
a PMOS transistor having a source connected to the output terminal of the level-shifter circuit, and a bulk tied to the source; and
a guard ring structure surrounding the PMOS transistor.

13. The non-volatile memory circuit according to claim 12, wherein the PMOS transistor comprises:
an n-type well region;
a first elongated p-type doped region formed in the n-type well region;
a first elongated n+ type doped region formed in the n-type well region and aligned in parallel with the first p-type doped region;
a second elongated p-type doped region formed between the first p-type doped region and the first n+ type doped region;
a drain metal structure connected between the first elongated p-type doped region and the system voltage source;
a first source metal structure connected to the output terminal of the charge pump, the first elongated n+ type doped region, and the second elongated p-type doped region; and
a gate structure formed over a channel region of the n-type well region located between the first and second p-type doped regions,
wherein the gate structure is connected to the output terminal of the level-shifter circuit.

14. The non-volatile memory circuit according to claim 13, wherein the PMOS transistor further comprises:
a second elongated n+ type doped region formed in the n-type well region such that the first p-type doped region is located between the second elongated n+ type doped region and the second elongated p-type doped region;
a third elongated p-type doped region formed between the first p-type doped region and the second n+ type doped region; and
a second source metal structure connected to the output terminal of the charge pump, the second elongated n+ type doped region, and the third elongated p-type doped region, wherein the gate structure further comprises a second portion formed over a channel region of the n-type well region located between the first and third p-type doped regions.

15. The non-volatile memory circuit according to claim 12, wherein the guard ring structure comprises:
a first guard ring connected to the system voltage source;
a second guard ring located inside of the first guard ring and connected to ground; and
a third guard ring located inside of the second guard ring and connected to the system voltage source.

16. The non-volatile memory circuit according to claim 15, wherein the third guard ring comprises:
an ring-shaped n-type well region formed in a substrate;
an n+ type diffusion region formed in the ring-shaped n-type well region adjacent to a surface of the substrate, and
a ring-shaped metal structure formed over a substrate and contacting the n+ type diffusion.

17. The non-volatile memory circuit according to claim 16, wherein the PMOS transistor comprises:
a central n-type well region formed in a region of the substrate surrounded by the third guard ring such that a p-type substrate region is located between the ring-shaped n-type well region and the central n-type well region;
a first elongated p-type doped region formed in the central n-type well region;
a drain metal structure extending over the p-type substrate region and connecting the first elongated p-type doped region and the ring-shaped metal structure of the third guard ring; and
a first source metal structure connected to the output terminal of the charge pump, the first elongated n+ type doped region, and the second elongated p-type doped region.

18. The non-volatile memory circuit according to claim 16, wherein the PMOS transistor further comprises:
a first elongated n+ type doped region formed in the central n-type well region and aligned in parallel with the first p-type doped region;
a second elongated p-type doped region formed between the first p-type doped region and the first n+ type doped region;
a gate structure formed over a channel region of the n-type well region located between the first and second p-type doped regions,
wherein the gate structure is connected to the output terminal of the level-shifter circuit.

19. A voltage control circuit for an integrated circuit having an internal voltage source for generating a relatively low system voltage, and including a charge pump for selectively generating, in response to a charge pump enable signal, a charge pump voltage that is different from the system voltage, the charge pump voltage being generated at an output terminal of the charge pump, the voltage control circuit comprising:
a switch circuit including a PMOS transistor connected between the system voltage and the output terminal of the charge pump; and
means for coupling a gate terminal of the PMOS transistor to the charge pump output voltage when the charge pump enable signal is asserted, and for coupling the gate terminal of the PMOS transistor to ground when the charge pump enable signal is de-asserted.

20. The voltage control circuit according to claim 19, wherein the PMOS transistor is formed such that a bulk of the PMOS transistor is connected to its source, and wherein the switch circuit further comprises a guard ring structure surrounding the PMOS transistor.

* * * * *